United States Patent [19]
Kajitani et al.

[11] Patent Number: 5,808,898
[45] Date of Patent: Sep. 15, 1998

[54] METHOD OF PLACING AND EXTRACTING MODULES

[75] Inventors: Yoji Kajitani, 22-28, Sakuradai, Aoba-ku, Yokohama-shi, Kanagawa-ken, 227; Kunihiro Fujiyoshi; Shigetoshi Nakatake, both of Tatsunokuchi-machi; Hiroshi Murata, Kanazawa, all of Japan

[73] Assignee: Yoji Kajitani, Kanagawa-ken, Japan

[21] Appl. No.: 547,440

[22] Filed: Oct. 24, 1995

[51] Int. Cl.$^6$ ........................................... G06F 15/00
[52] U.S. Cl. ........................ 364/491; 364/488; 364/489; 364/490; 364/512
[58] Field of Search ................................ 364/488, 490, 364/489, 491, 512

[56] References Cited

U.S. PATENT DOCUMENTS

| | | | |
|---|---|---|---|
| 4,500,963 | 2/1985 | Smith et al. | 364/488 |
| 4,630,219 | 12/1986 | GiGiacomo et al. | 364/488 |
| 5,493,509 | 2/1996 | Matsumoto et al. | 364/491 |
| 5,625,568 | 4/1997 | Edwards et al. | 364/491 |
| 5,638,292 | 6/1997 | Ueda | 364/491 |

OTHER PUBLICATIONS

Dong et al., Constrained Floorplan Design for Flexible Blocks, IEEE, pp. 488–491, Nov. 1989.

Ying et al., An Analytical Approach to Floorplanning for Hierarchical Building Blocks Layout, IEEE, pp. 403–412, Apr. 1989.

Cai et al., A Fast Algorighm for Optimal Via–Shifting in Channel Compaction, IEEE, pp. 1940–1943, Jun. 11, 1991.

"Bounded–Slicing Structure for Module Placement," Technical Report of IEICE; Shigetoshi Nakatake, et al; pp. 19–24; Oct. 27, 1994.

"A Solution Space of Size $(n!)^2$ For Optimal Rectangle Packings," IEEE Circuits and Systems Society Tokyo Chapter; Murata et al; pp. 109–114; Apr. 20, 1995.

*Primary Examiner*—Kevin J. Teska
*Assistant Examiner*—Matthew C. Loppnow
*Attorney, Agent, or Firm*—Lyon, P.C.

[57] ABSTRACT

Method of placing and extracting modules in such a way that a minimum area capable of accommodating the modules can be systematically searched for. The placement of the modules is started with drawing a grid having partitions or rooms greater in number than the modules. The grid is drawn by horizontal and vertical lines. Each horizontal line extends across two horizontally adjacent rooms. Each vertical line extends across two vertically adjacent rooms. Then, rectangular modules are arranged in the drawn rooms. Thereafter, the vertical lines are shrunk so that the horizontal lines are brought close to the top or bottom side of the grid while maintaining the vertical lengths of the modules inside the rooms. Finally, the horizontal lines are shrunk so that the vertical lines are brought close to the left or right side of the grid while maintaining the horizontal lengths of the modules inside the rooms.

9 Claims, 5 Drawing Sheets

METHOD OF PLACING AND EXTRACTING MODULES

BACKGROUND OF THE INVENTION

1. Field of the Invention

The present invention relates to a method of placing a plurality of modules or raw materials on a base or in a container. The invention also relates to a method of extracting a plurality of modules or raw materials from a base or stock.

2. Description of the Related Art

This kind of method of placing and extracting modules is used in placement and designing of semiconductor integrated circuits and printed-wiring boards and also in a step for extracting a plurality of members of various sizes from a planar stock such as cloth and a steel plate.

Where modules or raw materials are placed or extracted, if the smallest stock can be used, then the cost of production can be lowered, or the performance of the finished product on which modules are arranged or placed can be improved.

The prior art method of deciding placement of modules when they are arranged or extracted is illustrated by referring to FIGS. 11 and 12. FIG. 11 shows the state in which the modules are dispersed. FIG. 12 shows the state in which the modules are gathered. In FIG. 11, modules mi of various sizes are shown. Assume a rectangular stock K having an area slightly larger than the total area of the modules mi. The outer fringe, or the frame W of the rectangle, of the stock K is drawn as shown in FIG. 12. It is necessary that all the modules mi be fitted in the frame W without overlapping each other.

Various methods are available to fit them in the frame as described above. A typical method starts with fitting the greatest module mi into the frame W. Then, the secondly largest module mi is fitted. In this manner, the modules are fitted in order of decreasing size. If every module mi is fitted, then no problem will take place. However, if this is not the case, then the arrangement of the module mi is modified, and they are again fitted. If they are unsuccessfully attempted to be fitted by try and error, then a slightly larger frame W is prepared, and the process is repeated. In this manner, the minimum frame W in which every module mi can be fitted is searched for.

Referring still to FIG. 12, it is assumed that modules m7 and m8 are interchanged in position. When their positions are changed, it is not necessary to greatly modify the positions of the other modules mi, provided that the modules m7 and m8 are substantially identical in size. Accordingly, if a change of the arrangement is repeated, the arrangement variations can be managed. However, if the modules mi such as m7 and m9 which are interchanged in position have considerably different sizes, and if the positions of these modules m7 and m9 are changed, then it is necessary to greatly modify the positions of the other modules mi. Therefore, if a change of the arrangement is repeated, it is difficult to manage the changes of the arrangement of the modules mi. As a result, it is difficult to systematically search for the minimum frame W.

Furthermore, with other proposed methods, it is difficult to systematically search for the minimum frame. In addition, it is necessary to perform an exorbitant amount of calculation.

SUMMARY OF THE INVENTION

The present invention is intended to solve these problems.

It is an object of the present invention to provide a method of placing and extracting raw materials or modules in such a way the minimum area capable of accommodating the modules can be systematically searched for.

It is an additional object of the invention to provide a method of placing and extracting raw materials or modules in such a way that the minimum area capable of accommodating the modules can be searched for with a small amount of calculation.

A method of placing modules in accordance with the present invention achieves the above-described objects and is intended to place a plurality of substantially rectangular modules (mi) of arbitrary sizes. This method comprises the following four steps:

1) In the first step, a lattice or grid (A) having partitions or rooms which are greater in number than the modules is drawn under the conditions a, b, c below. It is to be noted that this grid corresponds to grid (A) for placement of modules in the preferred embodiment of the invention and does not contain grid (C) for boundary conditions.

a. Partitions or rooms in the center of the grid, excluding rooms in peripheral portions of the grid, are drawn, using horizontal lines (B) each passing across two horizontally adjacent rooms and vertical lines (L) each passing across two vertically adjacent rooms.

b. The ends of the horizontal lines are located opposite to the centers of the vertical lines. The ends of the vertical lines are located opposite to the centers of the horizontal lines.

c. Rooms in the peripheral portions of the grid are drawn by the horizontal and vertical lines including a maximum possible number of horizontal and vertical lines each passing across two rooms while satisfying the condition b above. The other horizontal and vertical lines are drawn by horizontal and vertical lines each passing across only one room.

2) In the second step, the modules are placed in the rooms drawn in the first step.

3) In the third step, the vertical lines are shrunk while maintaining the vertical lengths of the modules inside the rooms. In this way, the horizontal lines are brought close to the top or bottom side of the grid.

4) In the fourth step, the horizontal lines are shrunk while maintaining the horizontal lengths of the modules inside the rooms. Thus, the vertical lines are brought close to the left or right side of the grid.

Sometimes, the arrangement of the modules in the second step is modified, and the third and fourth steps are repeated.

Sometimes, the grid is vertically and horizontally divided by a number equal to the number obtained by subtracting one from the twice the number of the modules.

In one aspect of the invention, each of the modules takes the form obtained by joining together substantially rectangular forms. The module shaped in this way is divided into substantially rectangular parts (a, b). The aforementioned first through fourth steps are carried out in the same manner as the foregoing. If a substantially rectangular module also exists, then this module forms a single, substantially rectangular part.

In another aspect of the invention, some of the modules are replaced with rectangular spaces (S) of arbitrary sizes. Then, the aforementioned first through fourth steps are carried out in the same manner as the foregoing.

In the fifth step, as a further aspect of the invention, instead of the modules, a module extraction pattern is placed. Modules are extracted according to this extraction pattern. Other objects and features of the invention will appear in the course of the description thereof, which follows.

DETAILED DESCRIPTION OF THE PREFERRED EMBODIMENTS

Figure 1:
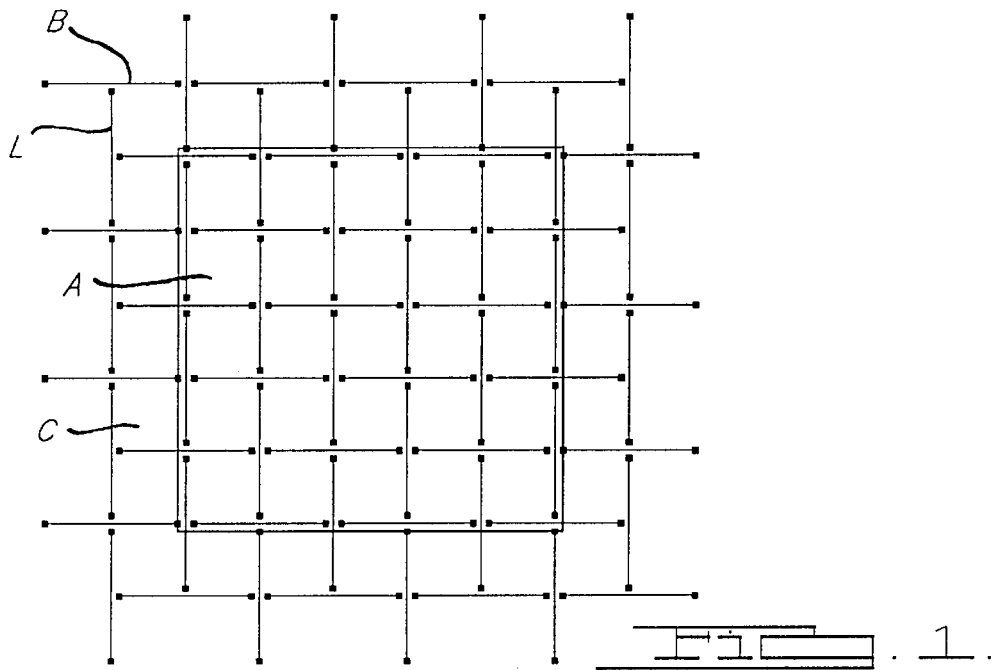
FIG. 1 is a diagram illustrating a grid used for a method of placing and extracting modules in accordance with the present invention.
Figure 2:
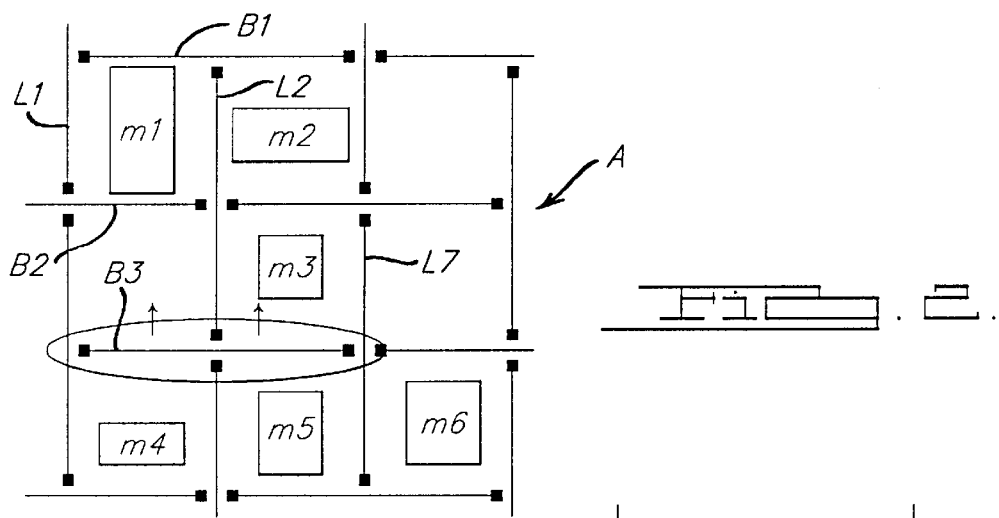
FIG. 2 is a diagram illustrating the initial step of the method illustrated in FIG. 1 when modules are arranged.
Figure 3:
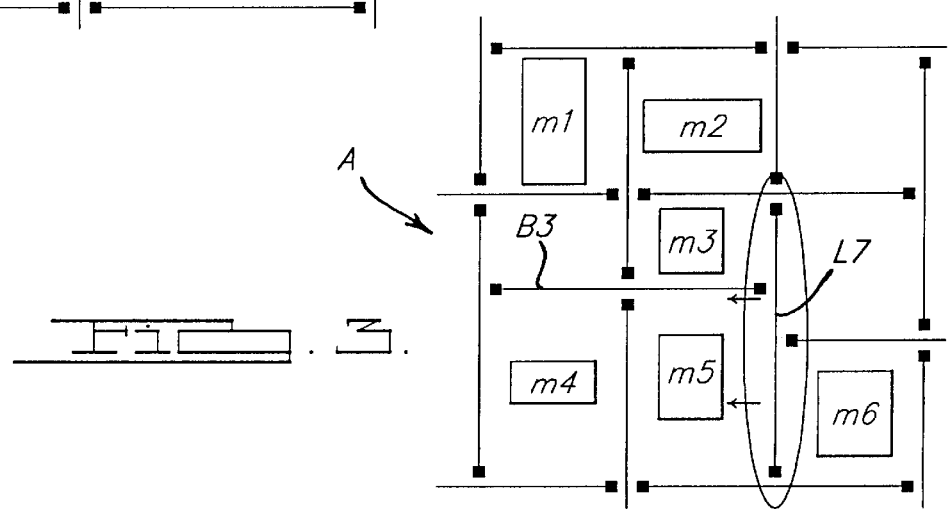
FIG. 3 is a diagram similar to FIG. 2, but illustrating the next step.
Figure 4:
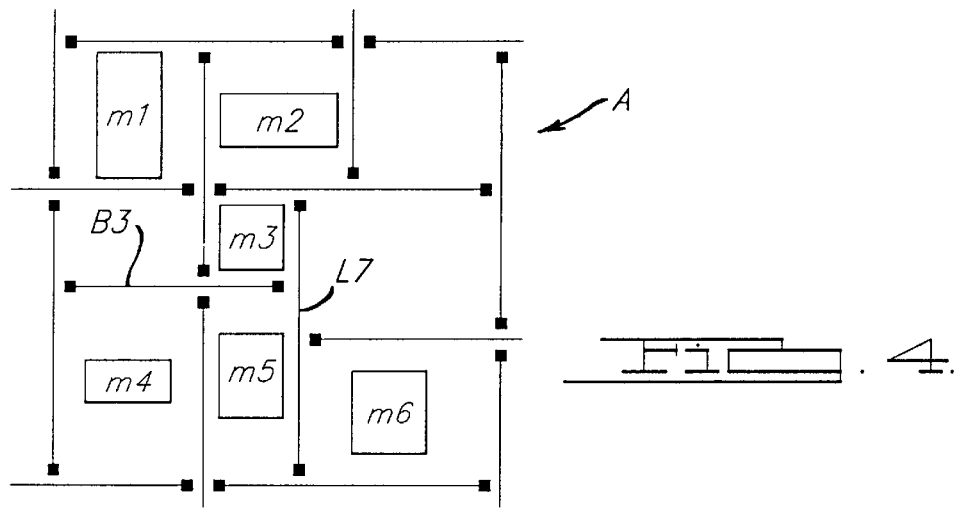
FIG. 4 is a diagram similar to FIG. 3, but illustrating the next step.
Figure 5:
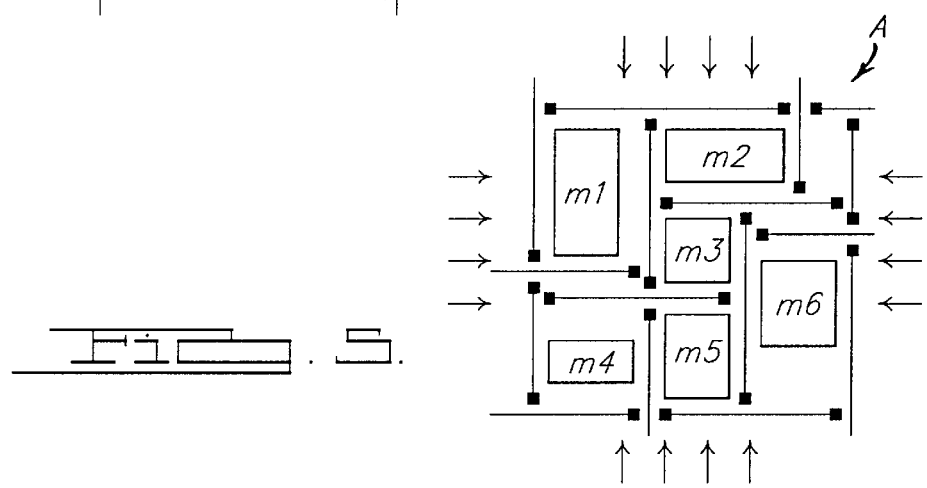
FIG. 5 is a diagram similar to FIG. 4, but illustrating the final step in which the modules have been collected.

A method of placing and extracting raw materials or modules in accordance with the present invention is described by referring to FIGS. 1–5. FIG. 1 illustrates a lattice or grid used for the novel method of placing and extracting modules. FIGS. 2 and 3 illustrate steps carried out when the modules are arranged. FIG. 2 illustrates the initial state when the modules are placed. FIG. 3 illustrates the next stage. FIG. 4 illustrates the stage next to the stage of FIG. 3. FIG. 5 illustrates the final stage in which the modules have been collected.

As the first stage, a grid as shown in FIG. 1 is drawn. The grid is rectangular in shape and has 7 partitions or rooms in the vertical direction and 7 partitions or rooms in the horizontal direction. The vertical lines L and the horizontal lines B of this grid are each split into several segments. The length of each line segment is equal to the total length of two rooms. Each of the vertical lines L and the horizontal lines B is so arranged that it extends across two rooms. Two vertical lines L which are adjacent to each other in the horizontal direction are out-of-phase. For example, if the left side of a room is formed by the upper segment of one vertical line L, then the right side of this room is formed by the lower segment of the adjacent vertical line L. Similarly, two horizontal lines B adjacent to each other in the vertical direction are out-out-phase. For instance, if the top side of a room is formed by the left segment of one horizontal line B, then the bottom side of this room is formed by the right segment of the adjacent horizontal line B. Therefore, it follows that at least one end of each horizontal line B is located opposite to the center of one vertical line L. On the other hand, at least one end of each vertical line L is positioned in an opposite relation to the center of one horizontal line B.

The 7×7 grid constructed in this way is composed of a central, dark grid A where modules are placed and a grid C for boundary conditions. The grid C is formed around the grid A. Therefore, the grid A for placement of the modules forms a 5×5 grid. The rooms in the grid C for the boundary conditions are arranged around the grid A. Each of the vertical lines L and horizontal lines B forming the central rooms of the grid A for placement of the modules runs across two rooms. However, some of the vertical lines L and horizontal lines B forming the peripheral rooms in the central grid A extend into the rooms of the grid C for the boundary conditions, and each extends across only one room of the grid A for placement of the modules.

As the second step, a plurality of rectangular modules mi of arbitrary sizes are arranged in the grid A constructed as described above, the grid A being used for placement of modules. A method of placing the modules is described by referring to FIGS. 2 and 3. For simplicity, a 3×3 grid A for placement of modules is used in FIGS. 2 and 3. As shown in FIG. 2, 6 modules mi are appropriately arranged in the grid A. This arrangement may be done at will. It is also possible to estimate an arrangement permitting the modules to be placed in the minimum area. Furthermore, it is possible to arrange them by a computer, using a table of random numbers. Each one module mi is positioned in one room. The same module mi is not placed in two rooms. Moreover, in one room, only one module mi is placed. Two modules mi are not placed in the same room. Accordingly, one module mi and the room in which this module mi is placed have a 1:1 relation to each other. Where a plurality of modules mi of the same shape are arranged, it follows that the different modules mi of the same shape are placed in different rooms.

After arranging the modules mi in this way, the third and fourth steps are carried out. That is, the horizontal lines B and the vertical lines L are moved in such a way that the rooms in the grid A for the arrangement of the modules decreases in area. For example, the vertical line L2 is shrunk, and the horizontal line B3 is moved upward (third step). This movement of this horizontal line B3 is made while maintaining the vertical length of the module m3. In this way, the state shown in FIG. 3 is obtained.

Referring next to FIG. 3, the horizontal line B3 is shrunk, and the vertical line L7 is moved to the left (fourth step). The movement of this vertical line L7 is made while maintaining the horizontal lengths of the modules m3 and m5. In this way, the state shown in FIG. 4 is obtained. Such movements of the horizontal lines B and of the vertical lines L are repeated to gather the modules mi as shown in FIG. 5.

As described already in connection with FIG. 1, the grid C for the boundary conditions is formed around the grid A for placement of the modules. The horizontal lines B and the vertical lines L forming the grid C for the boundary conditions are moved so that the rooms are reduced in size. When the rooms are packed in a smaller area, this smaller area can be placed on either side. However, when the rooms are packed in practice, priority is given to upward packing or downward packing to facilitate the calculation. Similarly, priority is given to leftward packing or rightward packing. The sides of the frame of the grid C for the boundary conditions to which priority is given in packing the rooms become straight lines. For example, if priority is given to upward packing and to leftward packing, the top side and the left side of the grid C for the boundary conditions become straight lines. That is, the grid C for the boundary conditions is provided over the whole periphery but it suffices to form the grid C around the placement grid A like the letter "L". More specifically, it is only necessary that the grid C be formed around one of the top and bottom sides of the grid A for the arrangement and around one of the left and right sides. Since the grid C having a grid similar to the grid A for the placement of the modules is disposed in this way, boundary conditions can be easily obtained. Calculations are easy to perform by a computer.

When the modules mi are gathered in this way, the size necessary for the arrangement of the modules mi is found. If a base or container larger than this found size is prepared, then the modules mi can be arranged on the base or in the container, or the modules mi can be extracted from the base (fifth step). When the modules mi are extracted, a pattern according to which the module mi are extracted is placed on the rooms instead of the modules mi.

If this size of the base is not satisfactory, and if one wants to reduce the size further, then the arrangement of the modules mi shown in FIG. 2 is modified. When a base of satisfactory size is obtained, the operation is ended. Of course, every arrangement can be discussed. Modifications of the arrangement can be made at random. It is also possible to compare an arrangement obtained after a modification with an arrangement obtained before the modification and to estimate an improved arrangement.

In the case of FIGS. 2 and 3, the number M of the modules mi is six. The grid is 3×3. In this case, a small degree of freedom is given to the relations among the modules mi and so it is not assured that the optimum solution is obtained. In order to obtain the optimum solution, every possible arrangement is discussed. If a (2M-1)×(2M-1) grid is employed, it is assured that an optimum solution is obtained. However, if the size of the grid is increased, the amount of calculation is increased. This makes the calculation difficult. Consequently, we consider that the maximum practical grid size is about (M)×(M).

Figure 6:
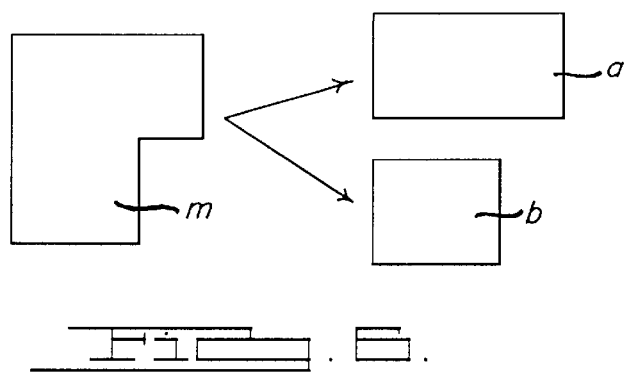
FIG. 6 is a plan view of an L-shaped module m, illustrating a method of assigning numerous L-shaped modules, but in which the L-shaped module m has been cut.
Figure 7:
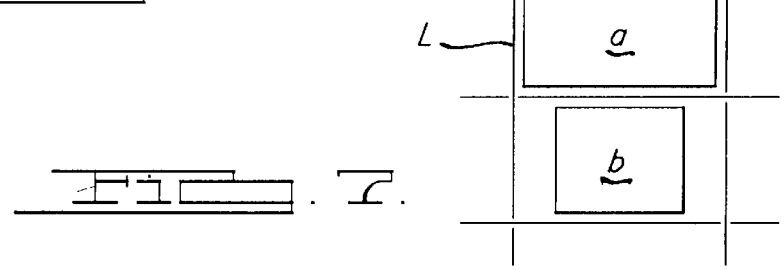
FIG. 7 is a diagram illustrating the manner in which the parts of the module m shown in FIG. 6 is assigned.
Figure 8:
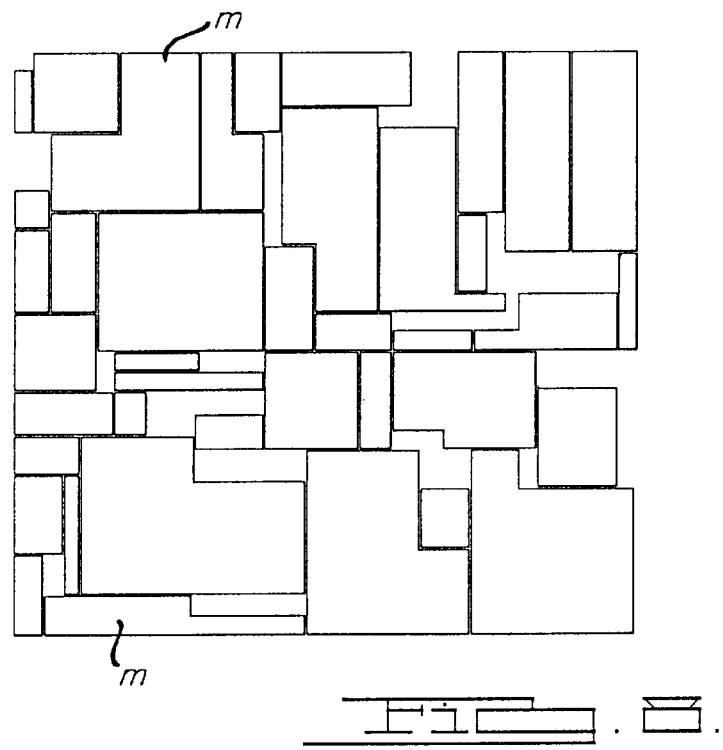
FIG. 8 is a diagram illustrating results of arrangement of modules.

The case in which L-shaped modules m are assigned to the rooms in the grid A for the placement of the modules is next described by referring to FIGS. 6–8, the shape of the L-shaped modules m being obtained by joining together rectangles. FIG. 6 is a plan view of one L-shaped module m. FIG. 6 is a cross-sectional view of the module m shown in FIG. 6. FIG. 7 illustrates the manner in which the parts of the module shown in FIG. 6 is assigned. FIG. 8 illustrates the results of arrangement of modules.

One L-shaped module m shown in FIG. 6 is divided into two rectangular parts a and b as shown in FIG. 6. In FIG. 6, the module is divided horizontally. The module also can be divided vertically. These parts a and b are assigned to two rooms which are adjacent to each other around the partition line, as shown in FIG. 7.

At this time, the side (in this case, the left side) which should maintain a straight line when the parts a and b are coupled together is so positioned as to border the same vertical line L or horizontal line B. In this way, a total arrangement as shown in FIG. 8 is obtained.

Sometimes, the base K does not take a rectangular form but its outer periphery is preferably notched so that the base K is provided with spaces S into which screws are inserted, or that the base is loaded into a case for a videotape recorder. In these cases, it is necessary to arrange the spaces S in the base K, i.e., in the grid A for the placement of the modules.

Figure 9A:
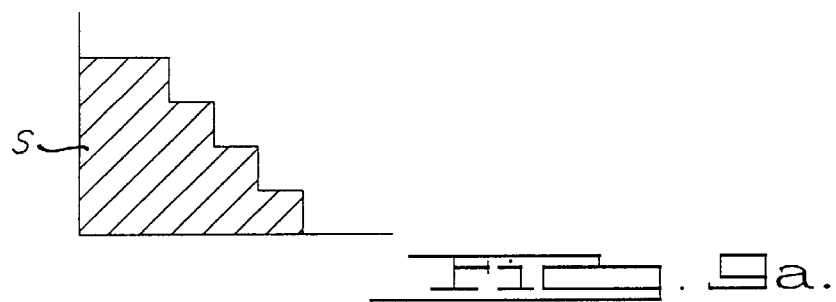
FIG. 9(a) is a plan view of spaces assigned, illustrating a method of assigning the spaces.
Figure 9B:
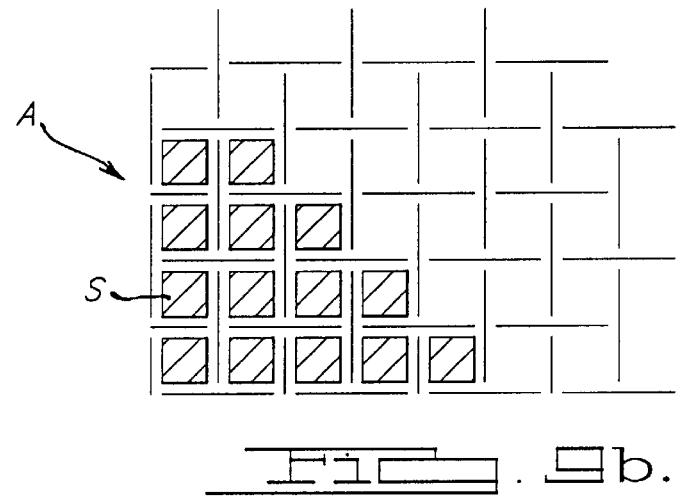
FIG. 9(b) is a diagram illustrating the manner in which the spaces shown in FIG. 9a have been assigned.
Figure 10:
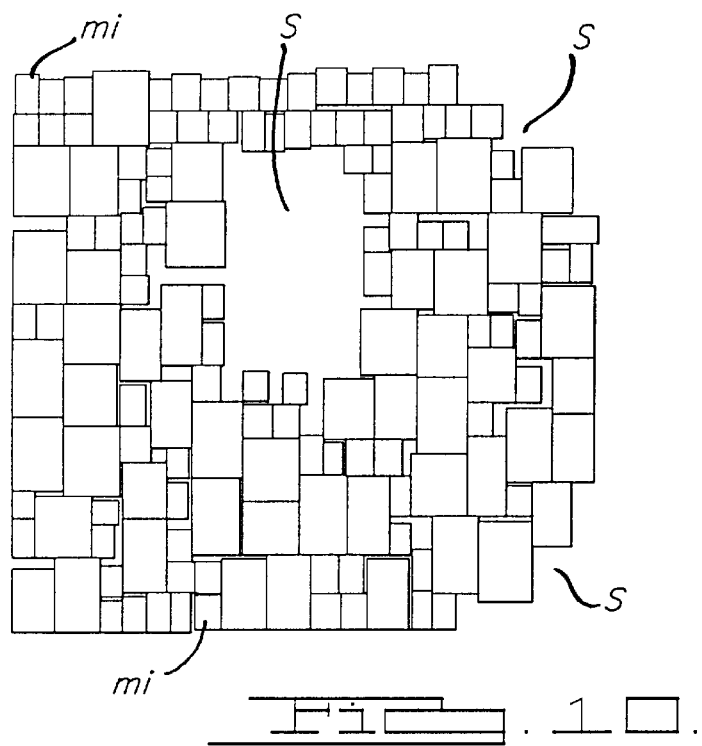
FIG. 10 is a diagram illustrating results of arrangement of spaces.
Figure 11:
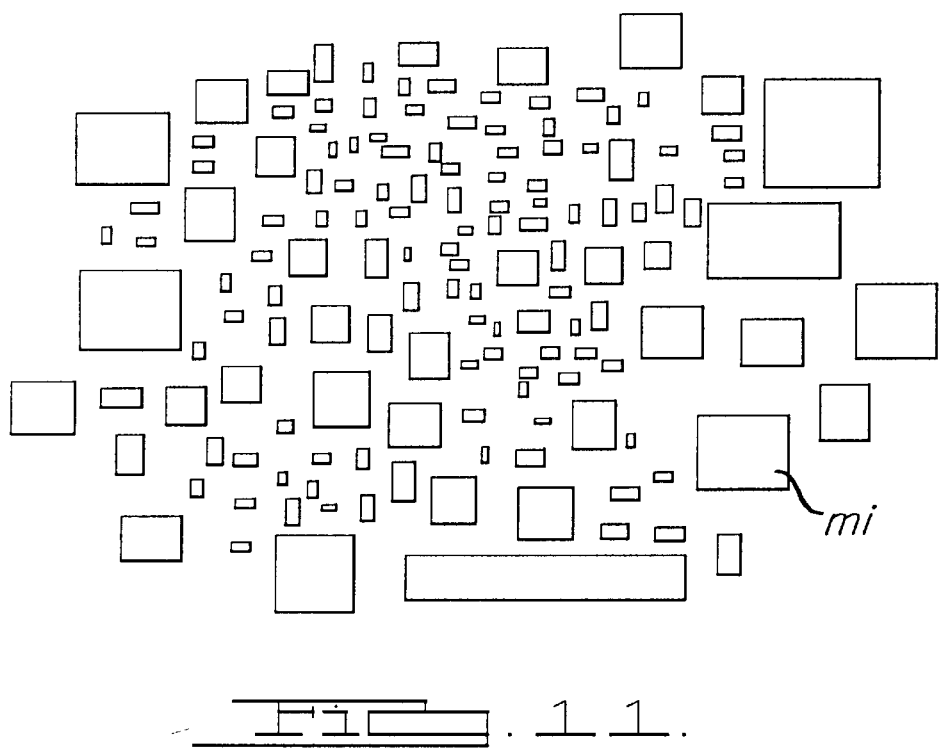
FIG. 11 is a diagram illustrating a method of deciding arrangement of modules, and in which the modules are dispersed.
Figure 12:
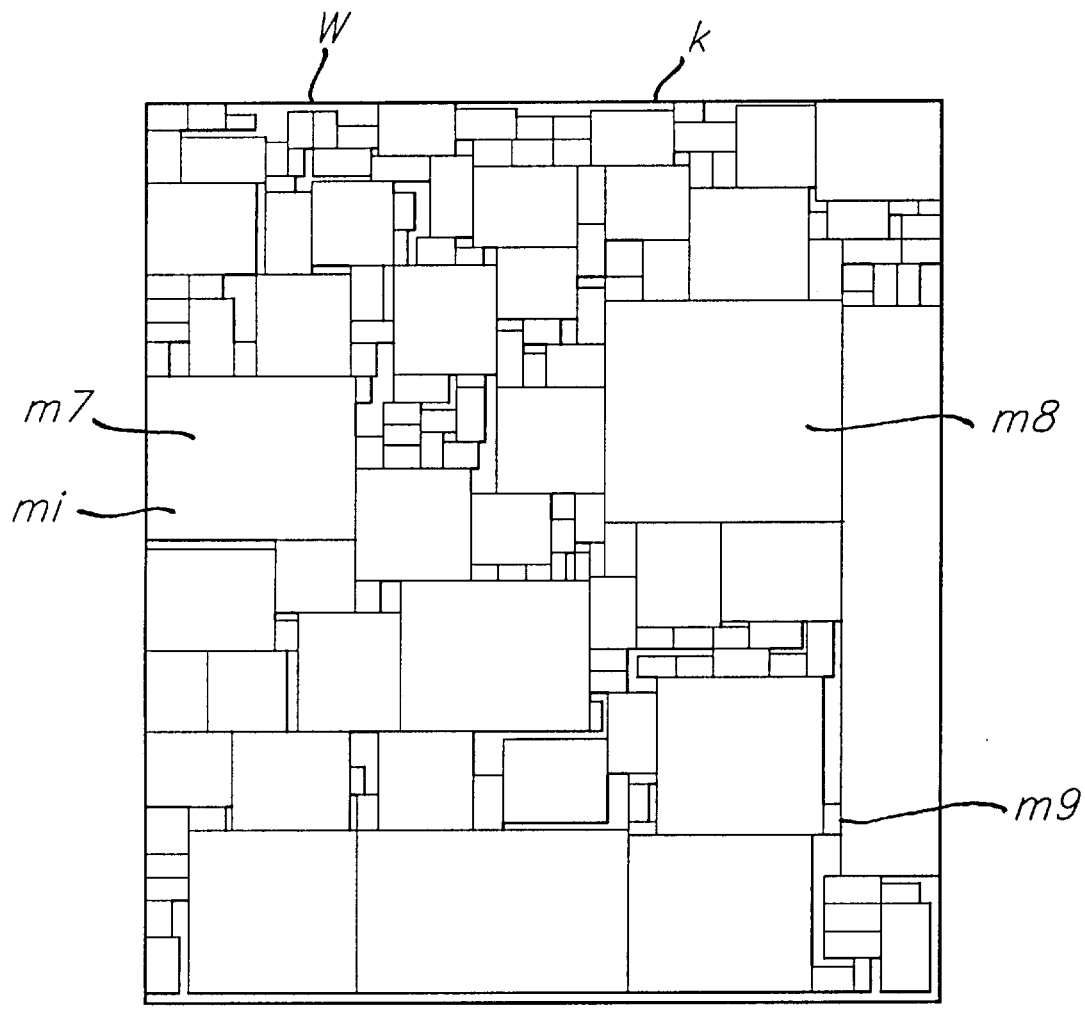
FIG. 12 is a diagram similar to FIG. 11, but in which the modules have been collected.

The case in which rectangular spaces S of arbitrary sizes are arranged in the grid A for the placement of the module is next described by referring to FIGS. 9a, 9b, and 10. FIGS. 9a and 9b illustrate a method of assigning the spaces. FIG. 9a is a plan view of an assigned space. FIG. 9b is a diagram illustrating the assignment. FIG. 10 illustrates the results of arrangement of the spaces.

The space shown in FIG. 9a is divided into rectangular spaces S as shown in FIG. 9b and arranged. Each space S has a fixed vertical length and a fixed horizontal length and is not deformed. The spaces S can be placed in the central portions of the grid A as well as in the marginal portions of the grid A. In this way, the spaces where the modules mi exist and the spaces where empty rooms S are present can be treated similarly. As a result, an arrangement resembling the letter "D" as shown in FIG. 10 can be obtained.

While some embodiments of the present invention have been described in detail, the scope of the invention is not limited to them. Rather, various modifications and changes are possible within the scope of the invention delineated by the accompanying claims. Examples of the modifications are given below.

(1) In the above embodiments, the grid A for the placement of the modules is a 5×5 grid. It is only necessary that the number of rooms in the grid A be larger than the total number of the modules. The shape of the grid can be changed appropriately. For example, the grid can be composed of a 4×8 grid.

(2) In the above embodiments, directions of the modules mi are not changed. It is also possible to vary the directions of the modules mi. That is, each module may be directed vertically or horizontally.

(3) In the above embodiments, the grid C for the boundary conditions is provided. This grid C facilitates establishing the boundary conditions when calculations are performed by a computer, but the grid C is not essential to the invention. The boundary conditions may be established by other means.

(4) In the above embodiments, rectangles are coupled together to form an L-shaped form. Other forms may also be created. For example, rectangles are arranged so as to form a T-shaped form. The parts of each module are arranged in two adjacent rooms so that the original shape consisting of rectangles can be regained. Where some rectangles are coupled together, forming recesses, rectangular spaces S of given sizes are arranged to secure the recesses.

(5) No limitations are imposed on the modules or on the base. However, optimum examples include placement and designing of semiconductor integrated circuits and printed-wiring boards where circuit elements are modules and circuit boards are bases. Furthermore, the invention is adapted for the case in which articles forming modules are loaded into a container. Moreover, the invention is adapted for the case in which a plurality of modules or raw materials of various sizes are extracted from a planar base such as cloth or steel plate.

(6) It is not necessary to form the grid A for placement of the modules on paper or the like in practice. The grid A may be formed in a virtual space created by a computer or the like.

(7) The third and fourth steps can be interchanged in order. Also, they can be carried out simultaneously.

(8) In the above embodiments, the modules are rectangular in shape. If the spaces or rooms secured to place the modules are rectangular in shape, the modules themselves are not always required to be rectangular.

(9) When the modules mi are arranged in the grid A for placement of the modules, the rooms in the lattice A may not physically large enough to accommodate the modules mi. In this case, it is necessary to enlarge the rooms. However, where a computer is used, modules mi are arranged in the rooms. The vertical and horizontal dimensions of each module mi are entered. The size of rooms corresponding to the modules mi is numerically secured. Accordingly, in the computer, infinitely large rooms are formed conceptually. Hence, any work for enlarging the rooms is not necessary.

In the present invention, a plurality of modules are arranged in a grid drawn by vertical and horizontal lines each extending across two rooms. Then, the modules are collected. Therefore, the operation is only to move the vertical or horizontal lines according to the sizes of the modules. In consequence, the work for placing the modules, including calculations necessary for the arrangement, can be carried out easily.

If the obtained arrangement is not satisfactory, the positions of some modules in the grid having a matrix of rooms are varied. This rearrangement does not always involve rearrangement of the other modules. As a result, it is easy to manage the arrangement of the modules. The modules can be rearranged systematically.

Sometimes, the grid is divided vertically and horizontally into parts which are equal in number to the number obtained by subtracting one from the twice the number of the modules. In this case, an arrangement providing minimum area can be derived.

Moreover, some modules are replaced by rectangular spaces of arbitrary sizes and so spaces can be formed around or inside the arranged modules. Consequently, spaces or notches for mounting with screws can be formed in the base on which the modules are arranged.

When a pattern according to which the modules mi are extracted is placed instead of modules, they can be extracted according to this pattern.

What is claimed is:

1. A method of minimizing the area of substrate required when placing a plurality of substantially rectangular modules of varying size, said method comprising the steps of:

drawing a grid having rooms which are greater in number than said modules, said rooms including peripheral rooms and central rooms, each of said central rooms being drawn by a plurality of horizontal lines and by a plurality of vertical lines, each of said horizontal lines extending across two horizontally adjacent ones of said rooms, each of said vertical lines extending across two vertically adjacent ones of said rooms, ends of said horizontal lines being located opposite to their respective centers of said vertical lines, ends of said vertical lines being located opposite to their respective centers of said horizontal lines, said peripheral rooms being formed by horizontal and vertical lines including a maximum possible number of horizontal and vertical lines each of which extends across two of said rooms in such a way that the ends of said horizontal lines are located opposite to their respective centers of said vertical lines and that the ends of said vertical lines are located opposite to their respective centers of said horizontal lines, said horizontal and vertical lines forming said peripheral rooms further including horizontal and vertical lines each extending across only one of said rooms;

placing said modules in the drawn rooms;

shrinking said vertical lines so that said horizontal lines are brought close to the top or bottom side of said grid while maintaining vertical lengths of said modules inside said rooms; and shrinking said horizontal lines so that said vertical lines are brought close to the left or right side of said grid while maintaining horizontal lengths of said modules inside said rooms.

2. The method of claim 1, further comprising the steps of:

rearranging said modules; and repeating said step of shrinking said vertical lines and said step of shrinking said horizontal lines.

3. The method of claim 1 or 2, wherein said grid is vertically and horizontally divided by a number obtained by subtracting one from twice the number of said modules.

4. A method of minimizing the area of substrate required when placing a plurality of modules of varying size, each of said modules being shaped by combining together a plurality of rectangles, said method comprising the steps of:

dividing each of said modules into plural substantially rectangular parts;

drawing a grid having rooms which are greater in number than the parts obtained from said modules, said rooms including peripheral rooms and central rooms, each of said central rooms being drawn by a plurality of horizontal lines and by a plurality of vertical lines, each of said horizontal lines extending across two horizontally adjacent ones of said rooms, each of said vertical lines extending across two vertically adjacent ones of said rooms, ends of said horizontal lines being located opposite to their respective centers of said vertical lines, ends of said vertical lines being located opposite to their respective centers of said horizontal lines, said peripheral rooms being formed by horizontal and vertical lines including a maximum possible number of horizontal and vertical lines each of which extends across two of said rooms in such a way that the ends of said horizontal lines are located opposite to their respective centers of said vertical lines and that the ends of said vertical lines are located opposite to their respective centers of said horizontal lines, said horizontal and vertical lines forming said peripheral rooms further including horizontal and vertical lines each extending across only one of said rooms;

placing said parts in said rooms of said grid in such a way that the parts forming the same module are assigned to adjacent ones of said rooms;

shrinking said vertical lines so that said horizontal lines are brought close to the top or bottom side of said grid while maintaining vertical lengths of said parts inside said rooms; and shrinking said horizontal lines so that said vertical lines are brought close to the left or right side of said grid while maintaining horizontal lengths of said parts inside said rooms.

5. The method of claim 4, further comprising the steps of:

rearranging said parts; and repeating said step of shrinking said vertical lines and said step of shrinking said horizontal lines.

6. A method of minimizing the area of substrate required when placing a plurality of spaces for accommodating substantially rectangular modules of varying size and a plurality of spaces for accommodating rectangular empty rooms of varying size, said method comprising the steps of:

drawing a grid having rooms which are greater in number than said spaces, said rooms including peripheral rooms and central rooms, each of said central rooms being drawn by a plurality of horizontal lines and by a plurality of vertical lines, each of said horizontal lines extending across two horizontally adjacent ones of said rooms, each of said vertical lines extending across two vertically adjacent ones of said rooms, ends of said horizontal lines being located opposite to their respective centers of said vertical lines, ends of said vertical lines being located opposite to their respective centers of said horizontal lines, said peripheral rooms being formed by horizontal and vertical lines including a maximum possible number of horizontal and vertical lines each of which extends across two of said rooms in such a way that the ends of said horizontal lines are located opposite to their respective centers of said vertical lines and that the ends of said vertical lines are located opposite to their respective centers of said horizontal lines, said horizontal and vertical lines forming said peripheral rooms further including horizontal and vertical lines each extending across only one of said rooms;

placing said spaces in the drawn rooms;

shrinking said vertical lines so that said horizontal lines are brought close to the top or bottom side of said grid while maintaining vertical lengths of said spaces inside said rooms; and shrinking said horizontal lines so that said vertical lines are brought close to the left or right side of said grid while maintaining horizontal lengths of said spaces inside said rooms.

7. The method of claim 6, further comprising the steps of:

rearranging said spaces; and repeating said step of shrinking said vertical lines and said step of shrinking said horizontal lines.

8. A method of minimizing the area of substrate required when extracting a plurality of substantially rectangular modules of varying size, said method comprising the steps of:

drawing a grid having rooms which are greater in number than the extracted modules, said rooms including peripheral rooms and central rooms, each of said central rooms being drawn by a plurality of horizontal lines and by a plurality of vertical lines, each of said horizontal lines extending across two horizontally adjacent ones of said rooms, each of said vertical lines extending across two vertically adjacent ones of said rooms, ends of said horizontal lines being located opposite to their respective centers of said vertical lines, ends of said vertical lines being located opposite to their respective centers of said horizontal lines, said peripheral rooms being formed by horizontal and vertical lines including a maximum possible number of horizontal and vertical lines each of which extends across two of said rooms in such a way that the ends of said horizontal lines are located opposite to their respective centers of said vertical lines and that the ends of said vertical lines are located opposite to their respective centers of said horizontal lines, said horizontal and vertical lines forming said peripheral rooms further including horizontal and vertical lines each extending across only one of said rooms;

preparing a pattern according to which said modules should be extracted;

placing said pattern in the drawn rooms;

shrinking said vertical lines so that said horizontal lines are brought close to the top or bottom side of said grid while maintaining vertical lengths of said spaces inside said rooms; and shrinking said horizontal lines so that said vertical lines are brought close to the left or right side of said grid while maintaining horizontal lengths of said spaces inside said rooms.

9. The method of claim 8, further comprising the steps of:

rearranging said pattern;

repeating said step of shrinking said vertical lines and said step of shrinking said horizontal lines;

searching for an optimum arrangement of said pattern; and then carrying out said step of extracting said modules according to the placed pattern.

* * * * *